United States Patent
Noda et al.

(10) Patent No.: US 9,186,787 B2
(45) Date of Patent: Nov. 17, 2015

(54) INTERNAL TEMPERATURE ESTIMATION UNIT FOR BATTERY FOR ELECTRIC POWER TOOL, AND APPARATUS FOR ELECTRIC POWER TOOL

(75) Inventors: Masafumi Noda, Anjo (JP); Hisakazu Okabayashi, Anjo (JP); Tadahiko Kobayakawa, Anjo (JP)

(73) Assignee: MAKITA CORPORATION, Anjo (JP)

( * ) Notice: Subject to any disclaimer, the term of this patent is extended or adjusted under 35 U.S.C. 154(b) by 322 days.

(21) Appl. No.: 13/640,424

(22) PCT Filed: Feb. 3, 2011

(86) PCT No.: PCT/JP2011/052261
§ 371 (c)(1),
(2), (4) Date: Oct. 10, 2012

(87) PCT Pub. No.: WO2011/132446
PCT Pub. Date: Oct. 27, 2011

(65) Prior Publication Data
US 2013/0027828 A1    Jan. 31, 2013

(30) Foreign Application Priority Data
Apr. 21, 2010  (JP) ................................ 2010-098322

(51) Int. Cl.
H02J 7/04 (2006.01)
B25F 5/00 (2006.01)
(Continued)

(52) U.S. Cl.
CPC ... *B25F 5/00* (2013.01); *G01K 7/42* (2013.01); *G01K 13/10* (2013.01); *H01M 10/443* (2013.01);
(Continued)

(58) Field of Classification Search
CPC ..... B25F 5/00; H01M 10/486; H01M 10/443; G01R 31/3675; H02J 7/0091; G01K 13/10
USPC .................................. 320/107, 134, 136, 150
See application file for complete search history.

(56) References Cited

U.S. PATENT DOCUMENTS 4,622,509 A * 11/1986 Spruijt ........................... 320/130
4,845,419 A * 7/1989 Hacker ......................... 320/136
(Continued)

FOREIGN PATENT DOCUMENTS

CN    101119111 A    2/2008
EP    1 128 517 A2   8/2001
(Continued)

OTHER PUBLICATIONS

International Search Report issued in Application No. PCT/JP2011/052261; Dated Apr. 26, 2011 (With Translation).
(Continued)

*Primary Examiner* — Helen Rossoshek
(74) *Attorney, Agent, or Firm* — Oliff PLC

(57) ABSTRACT

An internal temperature estimation unit, which reads a detected temperature of a cell of a battery for an electric power tool to estimate an internal temperature of the battery based on the detected temperature, includes: an initial-value setting device which reads, when a discharge/charge of the battery is started, the detected temperature and sets the detected temperature as an initial value; and a temperature increase amount calculation device which calculates a temperature increase amount of the cell of the battery based on a latest value of the detected temperature and the initial value set by the initial-value setting device; the internal temperature estimation unit outputs the temperature increase amount as an estimated value representing the internal temperature of the battery.

7 Claims, 8 Drawing Sheets

(51) Int. Cl.
*G01K 7/42* (2006.01)
*G01K 13/10* (2006.01)
*H01M 10/44* (2006.01)
*H01M 10/48* (2006.01)
*H02J 7/00* (2006.01)
*G01R 31/36* (2006.01)

(52) U.S. Cl.
CPC ......... *H01M 10/486* (2013.01); *G01R 31/3675* (2013.01); *H01M 2220/30* (2013.01); *H02J 7/0047* (2013.01); *H02J 2007/0067* (2013.01)

(56) References Cited

U.S. PATENT DOCUMENTS

| | | | |
|---|---|---|---|
| 5,397,974 A | | 3/1995 | Tamai et al. |
| 5,493,199 A | * | 2/1996 | Koenck et al. ............... 320/106 |
| 5,592,070 A | * | 1/1997 | Mino ............................. 320/163 |
| 5,646,508 A | | 7/1997 | Van Phuoc et al. |
| 5,912,547 A | * | 6/1999 | Grabon ......................... 320/150 |
| 6,020,721 A | * | 2/2000 | Brotto .......................... 320/150 |
| 6,229,280 B1 | * | 5/2001 | Sakoh et al. ................. 320/106 |
| 6,326,767 B1 | * | 12/2001 | Small et al. .................. 320/116 |
| 6,489,751 B2 | * | 12/2002 | Small et al. .................. 320/150 |
| 7,081,737 B2 | * | 7/2006 | Liu et al. ...................... 320/130 |
| 7,187,156 B2 | * | 3/2007 | Nakasho et al. .............. 320/107 |
| 7,443,139 B2 | * | 10/2008 | Mitsui et al. ................. 320/134 |
| 7,501,797 B2 | * | 3/2009 | Satoh et al. .................. 320/136 |
| 7,514,902 B2 | * | 4/2009 | Tsuchiya et al. ............. 320/132 |
| 7,528,580 B2 | * | 5/2009 | Sim .............................. 320/150 |
| 7,570,013 B2 | * | 8/2009 | Graeber et al. ............... 320/106 |
| 7,680,613 B2 | * | 3/2010 | Lim et al. ...................... 702/63 |
| 8,159,194 B2 | * | 4/2012 | Mori et al. .................... 320/150 |
| 8,174,811 B2 | * | 5/2012 | Hasunuma et al. ........... 361/106 |
| 8,248,033 B2 | * | 8/2012 | Nishi et al. ................... 320/132 |
| 8,288,998 B2 | * | 10/2012 | Masuda ......................... 320/134 |
| 8,488,286 B2 | * | 7/2013 | Noda ............................. 361/78 |
| 8,513,922 B2 | * | 8/2013 | Yang et al. .................... 320/152 |
| 2001/0017531 A1 | | 8/2001 | Sakakibara et al. |
| 2002/0195999 A1 | * | 12/2002 | Kimura et al. ................ 320/134 |
| 2003/0178968 A1 | | 9/2003 | Sakakibara et al. |
| 2004/0135553 A1 | | 7/2004 | Sakakibara |
| 2006/0043928 A1 | * | 3/2006 | Nakasho et al. .............. 320/112 |
| 2007/0193762 A1 | | 8/2007 | Arimura et al. |
| 2010/0079111 A1 | * | 4/2010 | Masuda ......................... 320/134 |
| 2010/0079112 A1 | * | 4/2010 | Nagashima ................... 320/134 |
| 2010/0201321 A1 | * | 8/2010 | Asakura et al. ............... 320/132 |
| 2012/0004873 A1 | * | 1/2012 | Li .................................... 702/63 |
| 2012/0074877 A1 | * | 3/2012 | Shi et al. ....................... 318/139 |
| 2012/0162840 A1 | | 6/2012 | Noda .............................. 361/78 |
| 2013/0033233 A1 | * | 2/2013 | Noda et al. ................... 320/134 |
| 2013/0033790 A1 | * | 2/2013 | Kobayakawa et al. ......... 361/87 |
| 2013/0108904 A1 | * | 5/2013 | Okabayashi ................... 429/90 |
| 2013/0207614 A1 | * | 8/2013 | Schafer et al. ................ 320/134 |
| 2014/0177145 A1 | * | 6/2014 | Kawahara et al. ....... 361/679.01 |
| 2014/0312915 A1 | * | 10/2014 | Mukaitani et al. ............ 324/434 |

FOREIGN PATENT DOCUMENTS

| | | |
|---|---|---|
| EP | 1 825 964 A1 | 8/2007 |
| JP | A-08-308139 | 11/1996 |
| JP | A-09-331638 | 12/1997 |
| JP | A-2001-112185 | 4/2001 |
| JP | B2-132-3219524 | 10/2001 |
| JP | A-2004-208349 | 7/2004 |
| JP | B2-3583155 | 10/2004 |
| JP | A-2006-247821 | 9/2006 |
| JP | B2-132-4096211 | 6/2008 |

OTHER PUBLICATIONS

International Preliminary Report on Patentability issued in Application No. PCT/JP2011/052261 (With Translation).
Extended European Search Report issued in European Patent Application No. 11771786.8 on Apr. 25, 2014.
Dec. 17, 2013 Office Action issued in Japanese Patent Application No. 2010-098322 (with English translation).
Chinese Office Action issued in Chinese Patent Application No. 201180020013.X on Mar. 6, 2014 (with translation).

* cited by examiner

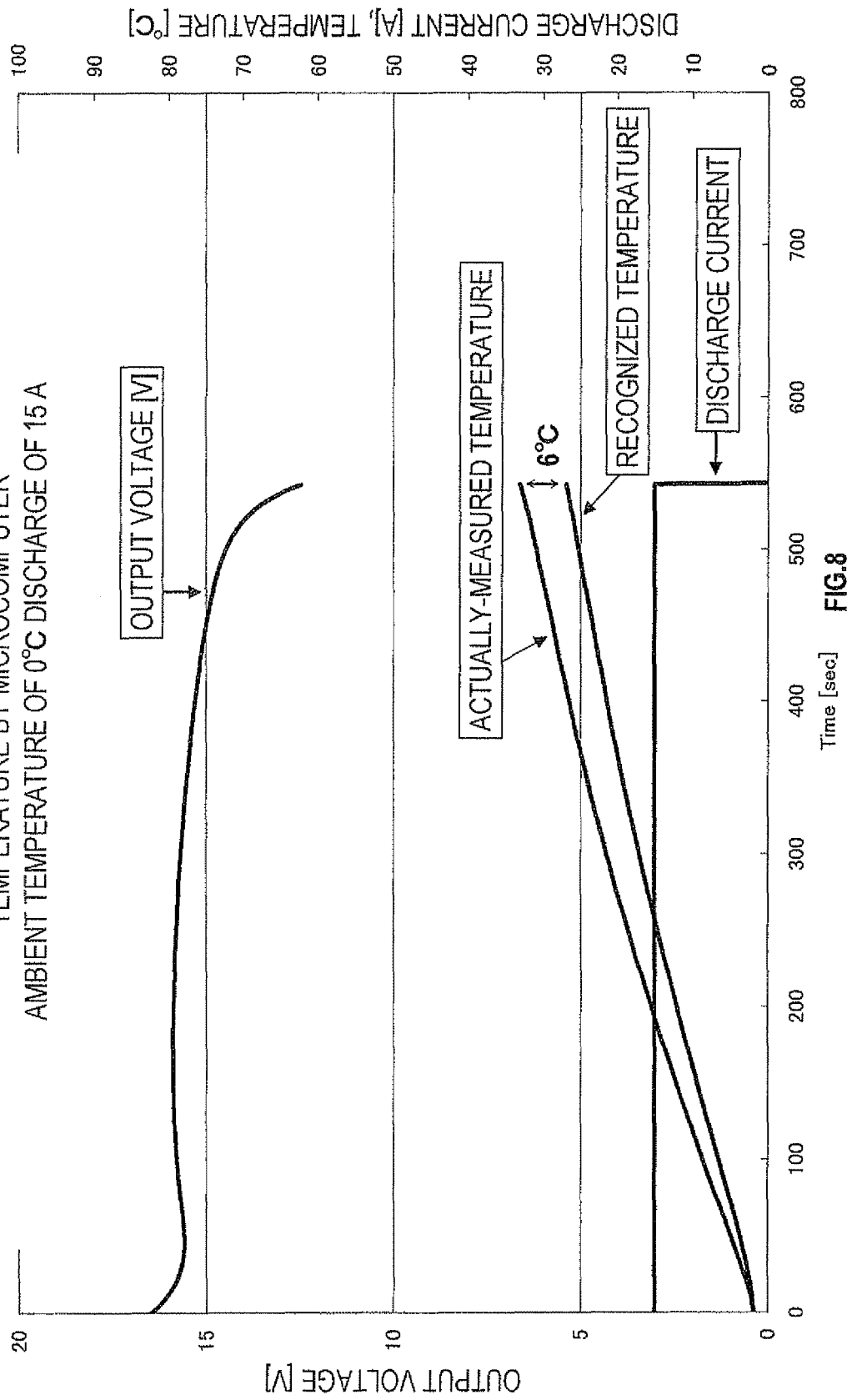

INTERNAL TEMPERATURE ESTIMATION UNIT FOR BATTERY FOR ELECTRIC POWER TOOL, AND APPARATUS FOR ELECTRIC POWER TOOL

CROSS-REFERENCE TO RELATED APPLICATIONS

This international application claims the benefit of Japanese Patent Application No. 2010-098322 filed Apr. 21, 2010 in the Japan Patent Office, and the entire disclosure of Japanese Patent Application No. 2010-098322 is incorporated herein by reference.

TECHNICAL FIELD

The present invention relates to an internal temperature estimation unit that estimates an internal temperature of a battery used as a power source of an electric power tool, and an apparatus for electric power tool including the internal temperature estimation unit therein.

BACKGROUND ART

A conventional battery used as a power source of an electronic device has a problem in which the battery is deteriorated when a temperature during charge or discharge deviates from a given temperature range.

Therefore, it has been conventionally proposed to incorporate a sensor for temperature detection (such as a thermistor) together with a battery, into a battery pack to be attached to an electronic device. Specifically, it is configured that the sensor for temperature detection detects a temperature of a cell of the battery (hereinafter, also simply referred to as battery temperature), during charge to the battery or discharge from the battery to the electronic device. It has been proposed that, when a temperature detected by the sensor deviates from an acceptable temperature range, the charge/discharge is suspended or a charge/discharge current is reduced (see Patent Document 1, for example).

That is, when the battery temperature increases and deviates from the acceptable temperature range during the charge or discharge, the charge to/discharge from the battery is suspended or the charge/discharge current is reduced so as to suppress a temperature increase in the cell of the battery, thereby protecting the battery.

PRIOR ART DOCUMENTS

Patent Documents

Patent Document 1: JP9331638A

SUMMARY OF THE INVENTION

Problems to be Solved by the Invention

However, since the sensor for temperature detection is disposed around the battery, a temperature which can be detected by the sensor is an ambient temperature of the battery. Therefore, it is not possible to detect, by using this sensor, an internal temperature (an internal temperature of the battery) which affects characteristics of the battery.

For example, a temperature of the battery increases due to charge/discharge. When the temperature increases, the internal temperature of the battery becomes higher than a surface temperature of the battery. Consequently, there exists a difference between a detected temperature by the sensor and the internal temperature of the battery.

Especially, in an electric power tool, since it is necessary to supply a large volume of electric current to a driving power source such as a motor, etc., the battery has a relatively large capacity. Furthermore, as a time period during which the electric current flows becomes longer, a difference between the detected temperature by the sensor and an actual internal temperature of the battery during the charge/discharge becomes greater.

For this reason, during the charge/discharge of the battery for electric power tool, if the charge to/discharge from the battery is limited (is suspended, or the current thereof is reduced) based on the detected temperature by the sensor, the following problem may arise. Specifically, despite that the internal temperature of the battery has gone beyond an acceptable temperature range, the detected temperature by the sensor does not reach an upper limit temperature; consequently, it may not be possible to limit the charge to/discharge from the battery. On the other hand, there has been a problem in which despite that the internal temperature of the battery has not gone beyond the acceptable temperature range since, for example, a period of the charging to/discharge from the battery is short, the detected temperature by the sensor has reached the upper limit temperature; thus, the charge to/discharge from the battery is made to be limited.

In the present invention, it is desirable to estimate the internal temperature of the battery for electric power tool, thereby making it possible to inhibit the internal temperature from reaching a limit temperature which is an upper limit of the acceptable temperature range.

Means for Solving the Problems

A first aspect of the present invention which has been made to achieve the aforementioned object relates to an internal temperature estimation unit which reads a detected temperature from a temperature detection device that detects a temperature of a cell of a battery for electric power tool so as to estimate an internal temperature of the battery based on the detected temperature.

In the internal temperature estimation unit of the present invention, when a discharge from the battery is started or when a charge to the battery is started, an initial-value setting device reads the detected temperature from the temperature detection device and sets the detected temperature as an initial value.

Moreover, during the discharge from the battery or during the charge to the battery, a temperature increase amount calculation device reads the detected temperature from the temperature detection device, and calculates a temperature increase amount of the cell of the battery based on a latest value of the read detected temperature and the initial value set by the initial-value setting device.

Then, the internal temperature estimation unit outputs the temperature increase amount calculated by the temperature increase amount calculation device, as an estimated value representing the internal temperature of the battery.

For example, each of FIGS. 7 and 8 shows a relationship among: a discharge current from the battery; an output voltage of the battery; a surface temperature (an actually-measured temperature) of the battery; and a recognized temperature recognized by a control microcomputer based on a detection signal from a sensor for temperature detection (a thermistor). Each of values was measured when the discharge current was flowed from the battery to a load.

As is obvious from FIGS. 7 and 8, when the discharge is started, the surface temperature of the battery and the recognized temperature by the microcomputer coincide with each other. After the discharge has been started, when the internal temperature of the battery increases due to the discharge, the surface temperature (actually-measured temperature) increases accordingly. The recognized temperature by the microcomputer increases with a delay from the increase of the surface temperature (actually-measured temperature). This delay causes a temperature difference between the surface temperature and the recognized temperature by the microcomputer. This temperature difference is substantially proportional to an increase amount of the recognized temperature by the microcomputer from the start of the discharge.

Although the internal temperature of the battery cannot be measured, a relationship between the internal temperature and the surface temperature of the battery is similar to a relationship between the surface temperature and the recognized temperature by the microcomputer. Specifically, the internal temperature and the surface temperature of the battery coincide with each other when the discharge is started; and when the internal temperature of the battery starts increasing due to the discharge after the discharge has been started, a temperature difference occurs. This temperature difference is also substantially proportional to the increase amount of the recognized temperature by the microcomputer from the start of the discharge.

Each of FIGS. 7 and 8 shows a characteristic during the discharge from the battery to the load, but does not show a characteristic during the charge. However, during the charge from the battery charger to the battery, temperature differences occur among the recognized temperature by the microcomputer, the surface temperature, and the internal temperature, in the same manner as the discharge.

In the present invention, a detected temperature when the discharge from the battery is started or when the charge to the battery is started (a battery temperature detected by the temperature detection device) is to be an initial value. Then, a temperature increase amount is calculated, which is an increase amount from the initial value of the battery temperature (detect temperature) detected by the temperature detection device during the discharge or the charge of the battery. This temperature increase amount is to be an estimated value representing the internal temperature of the battery.

As a result, when the internal temperature estimation unit according to the present invention is used, even if there is a temperature difference between the battery temperature (recognized temperature) which is read from the temperature detection device and recognized by the internal temperature estimation unit during the charge or the discharge of the battery, and the surface temperature (and therefore, the internal temperature) of the battery, the internal temperature of the battery can be estimated from the temperature increase amount of the recognized temperature from when the charge is started or when the discharge is started.

FIG. 7 shows measurement results at the ambient temperature of 25° C., while FIG. 8 shows measurement results at the ambient temperature of 0° C.

Although it is expected that the internal temperature and the surface temperature of the battery increase during the discharge or the charge of the battery, it is considered that the internal temperature and the surface temperature of the battery may decrease temporality due to a turbulence and the like, depending on a surrounding environment.

There may be a case where the surface temperature of the battery decreases during the discharge or the charge of the battery, and in accordance with the decrease of the surface temperature of the battery, the detect temperature by the temperature detection device (and therefore, the recognized temperature recognized by the internal temperature estimation unit) decreases, as described above. In this case, it is considered that if the initial value to be used to calculate the temperature increase amount is maintained to be the detect temperature detected at the time when the discharge of the battery is started or when the charge of the battery is started, it may not be possible to accurately calculate the temperature increase amount (in other words, the internal temperature).

Therefore, in a second aspect of the present invention, when the detected temperature read from the temperature detection device is below the initial value, the temperature increase amount calculation device may renew the initial value with the detected temperature read from the temperature detection device.

By the above configuration, the initial value is corrected such that the temperature increase amount (and therefore, the estimated value of the internal temperature) becomes higher. Therefore, by using the estimated value, it is possible to improve safety in suppressing the temperature increase of the sell of the battery.

Next, an apparatus for electric power tool according to a third aspect of the present invention includes the above-described internal temperature estimation unit of the present invention.

The determination device determines whether or not the estimated value obtained by the internal temperature estimation unit and representing the internal temperature of the battery exceeds a predetermined set temperature for overheat determination. When the determination device determines that the estimated value of the internal temperature exceeds the set temperature, a protection device suspends or limits the discharge from the battery or the charge to the battery. Thereby, the battery can be protected.

Thus, according to the apparatus for electric power tool of the present invention, it is possible to suppress deterioration of the battery or breakage of the battery when the internal temperature of the battery has reached the set temperature for overheat determination (in other words, an upper limit temperature of an acceptable temperature range or a limit temperature), during the charge or the discharge.

Here, as is obvious from FIGS. 7 and 8, the difference between the recognized temperature of the battery temperature and the actually-measured temperature (and therefore, the internal temperature) is as follows: as the ambient temperature is lower, the aforementioned difference becomes greater, and as the ambient temperature is higher, the aforementioned difference becomes smaller.

For this reason, in a fourth aspect of the present invention, there may be provided a first set-temperature correction device that corrects the set temperature for use in the overheat determination of the battery by the determination device, based on the detected temperature or the initial value of the detected temperature which is used to calculate the estimated value by the internal temperature estimation unit, such that the higher the detected temperature or the initial value is, the lower the set temperature becomes.

Depending on a status of the battery, the battery may be easily deteriorated due to a temperature increase. Therefore, in a fifth aspect of the present invention, a second set-temperature correction device may be provided. Specifically, the second set-temperature correction device may correct the set temperature for use in the overheat determination of the battery by the determination device, based on at least one of charge and discharge histories, an open voltage, and a remaining capacity of the battery.

When the set temperature for overheat determination is corrected by the first and second set-temperature correction devices, deterioration of the battery due to a temperature increase during the charge or the discharge of the battery can be more favorably suppressed.

In a sixth aspect of the present invention, when the protection device suspends or limits the discharge from the battery or the charge to the battery during the discharge from the battery or the charge to the battery, the protection device may limit a charge current that flows in a next charge to the battery or a discharge current that flows in a next discharge from the battery.

By this configuration, with respect to the battery whose internal temperature has reached the set temperature for overheat determination during the discharge of the charge, a charge/discharge current to this battery during a next charge or a next discharge is more limited than a normal time. Thereby, it is possible to inhibit the internal temperature of the battery from reaching the set temperature for overheat determination again.

The apparatus for electric power tool of the present invention may be a battery pack containing the battery therein, an electric power tool main body to which the battery pack is detachably attached, or a battery charger to which the battery pack is detachably attached.

BRIEF DESCRIPTION OF THE DRAWINGS

FIG. 8 is an explanatory diagram showing a relationship between an actually-measured temperature measured at a temperature condition different from a temperature condition in FIG. 7, and a recognized temperature by the microcomputer.

EXPLANATION OF REFERENCE NUMERALS

10 . . . main body (electric power tool main body), 14 . . . motor housing, 16 . . . gear housing, 18 . . . drill chuck, 20 . . . hand grip, 22 . . . trigger switch, SW1 . . . main switch, 24 . . . battery pack attachment portion, 32A . . . positive terminal, 32B . . . negative terminal, 34A . . . signal terminal, 36 . . . control power circuit, 38 . . . input/output circuit, L1A . . . positive power supply line, L1B . . . negative power supply line, M1 . . . drive motor, Q1 . . . transistor (N-channel MOSFET), 40 . . . battery pack, 42 . . . connector portion, 44 . . . power supply terminal portion, 44A . . . positive terminal, 44B . . . negative terminal, 46 . . . connection terminal portion, 46A-46C . . . signal terminal, 50 . . . battery, 52A . . . positive terminal, 52B . . . negative terminal, 60 . . . battery control circuit, 62 . . . current measurement circuit, 64 . . . voltage measurement circuit, 66 . . . temperature measurement circuit, 68 . . . switch operation detection circuit, 70 . . . MCU, 72 . . . battery charger detection circuit, L2A . . . positive power supply line, L2B . . . negative power supply line, Q4 . . . transistor (N-channel MOSFET), 80 . . . battery charger, 82 . . . battery pack attachment portion, 84 . . . power supply terminal portion, 84A . . . positive terminal, 84B . . . negative terminal, 86 . . . connection terminal portion, 86B, 86C . . . signal terminal, 88 . . . indicator portion, 92 . . . rectifier circuit, 94 . . . charging switching power circuit, 96 . . . MCU, 98 . . . controlling switching power circuit

MODE FOR CARRYING OUT THE INVENTION

An embodiment of the present invention is described below with reference to the drawings.
(Overall Configuration of Electric Power Tool)

Figure 1:
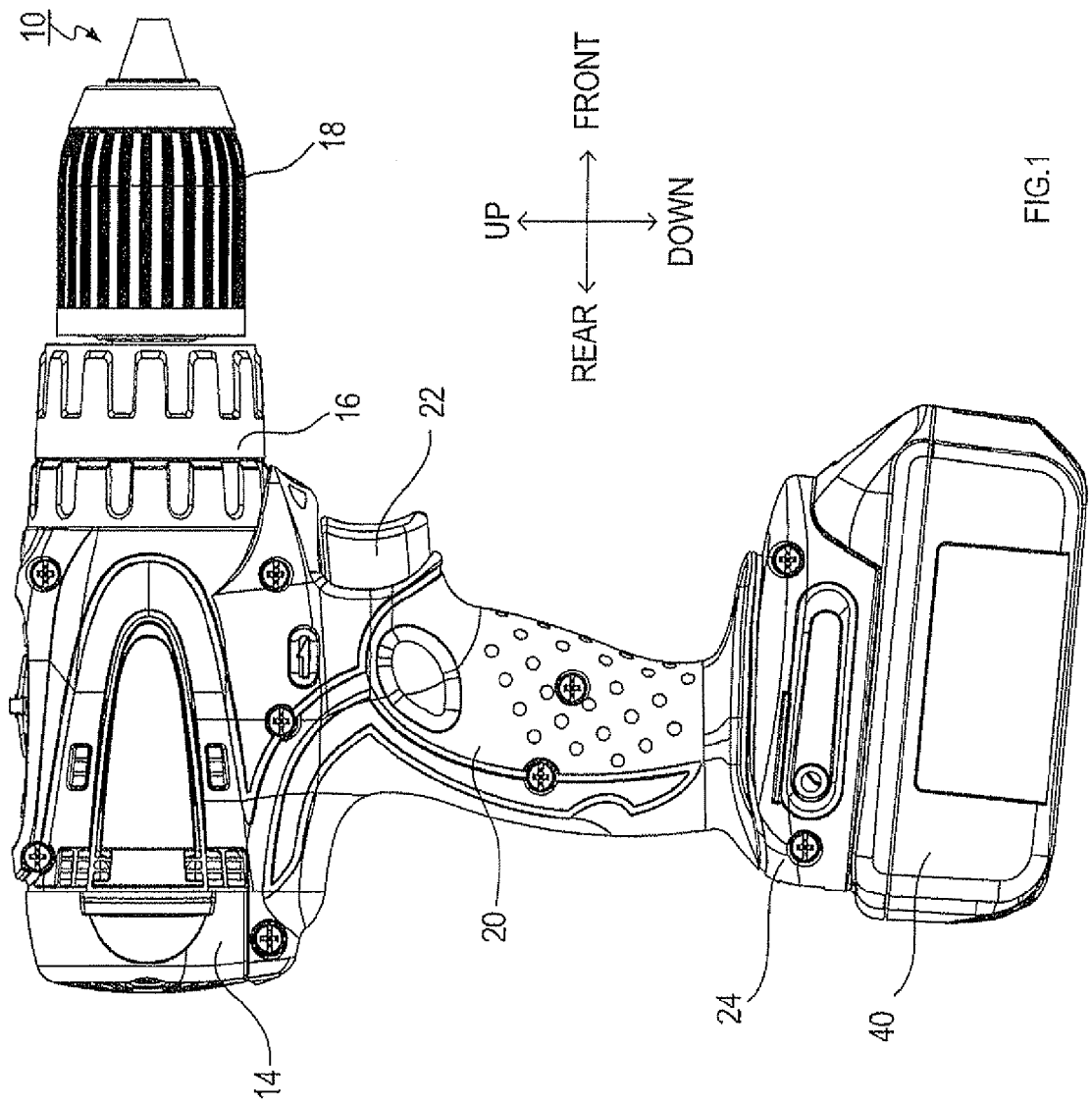
FIG. 1 is a side view showing a state where a battery pack is attached to an electric power tool main body of an embodiment.

FIG. 1 is a side view showing an electric power tool according to the present embodiment to which the present invention is applied.

As shown in FIG. 1, the electric power tool according to the present embodiment includes an electric power tool main body (hereinafter, also simply referred to as a "main body") 10, and a battery pack 40. The main body 20 is configured as a so-called driver drill. The battery pack 40 is detachably attached to the main body 10 to supply DC power to the main body 10.

The main body 10 includes a motor housing 14, a gear housing 16 positioned forward from the motor housing 14, a drill chuck 18 positioned forward from the gear housing 16, and a hand grip 20 positioned below the motor housing 14.

The motor housing 14 houses a drive motor M1 (see FIG. 4) that generates driving force to rotationally drive the drill chuck 18.

The gear housing 16 houses a gear mechanism (not shown) that transmits the driving force of the drive motor M1 to the drill chuck 18.

The drill chuck 18 includes an attachment mechanism (not shown) for detachable attachment of a tool bit (not shown) at a front end of the drill chuck 18.

The hand grip 20 is shaped such that a user of the electric power tool can hold the hand grip 20 with a single hand. At an upper front of the hand grip 20, there is provided a trigger switch 22. The trigger switch 22 is to be operated by the user of the electric power tool to drive or stop the drive motor M1.

Also, at a lower end of the hand grip 20, a battery pack attachment portion 24 is provided to detachably attach the battery pack 40 to the main body 10.

Figure 2:
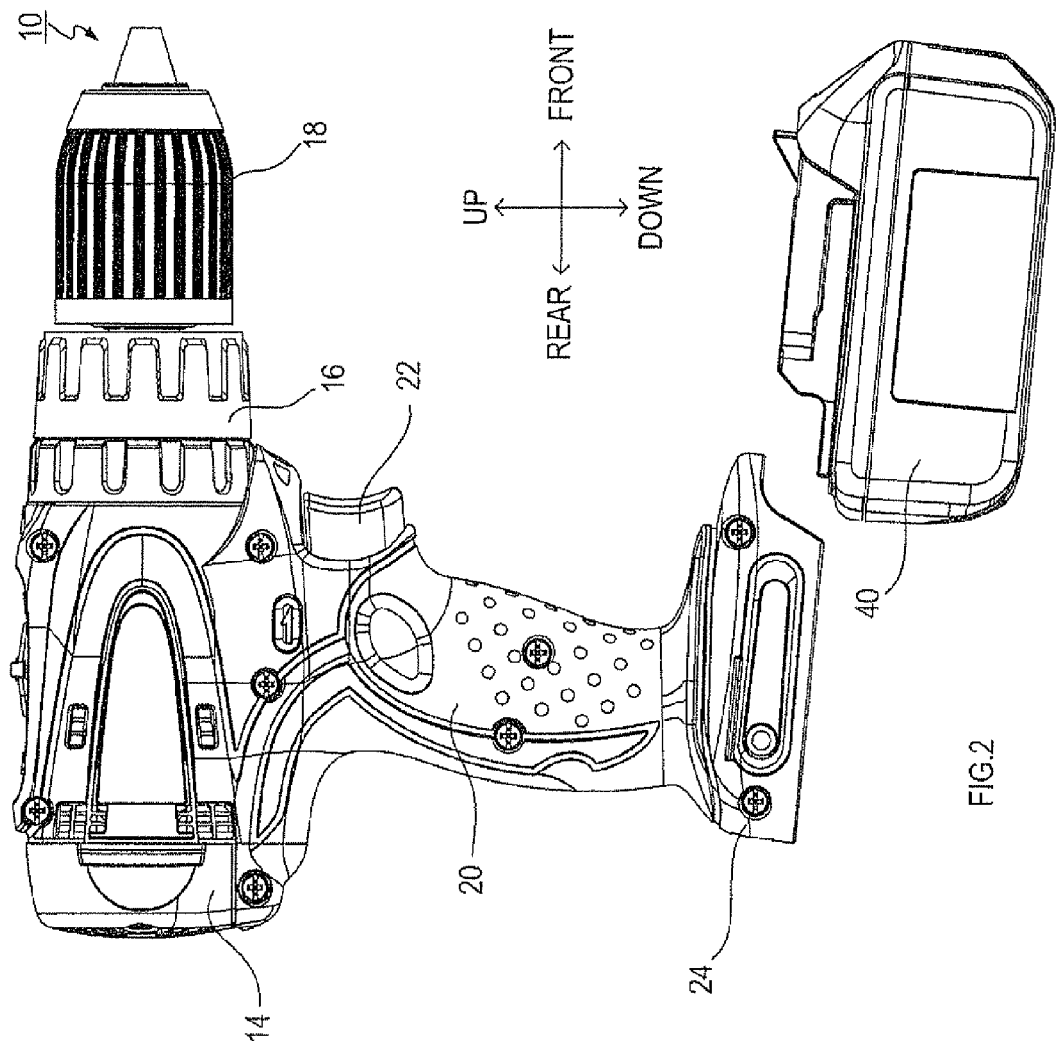
FIG. 2 is a side view showing a state where the battery pack is detached from the electric power tool main body of the embodiment.

More specifically, as shown in FIG. 2, the battery pack attachment portion 24 is configured such that the battery pack 40 can be detached from the battery pack attachment portion 24 when the user of the electric power tool slides the battery pack 40 in a forward direction. Here, FIG. 2 is a side view showing a state where the battery pack 40 is detached from the electric power tool main body 10.

Figure 3A:
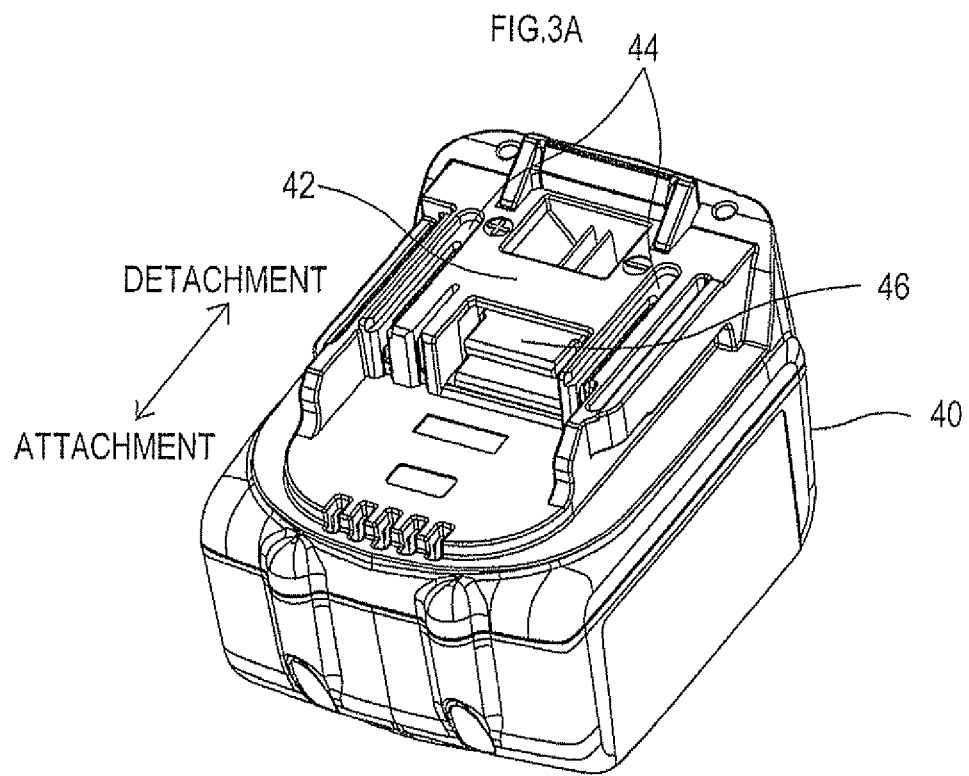
FIG. 3A is a perspective view showing an appearance of the battery pack of the embodiment.
Figure 3B:
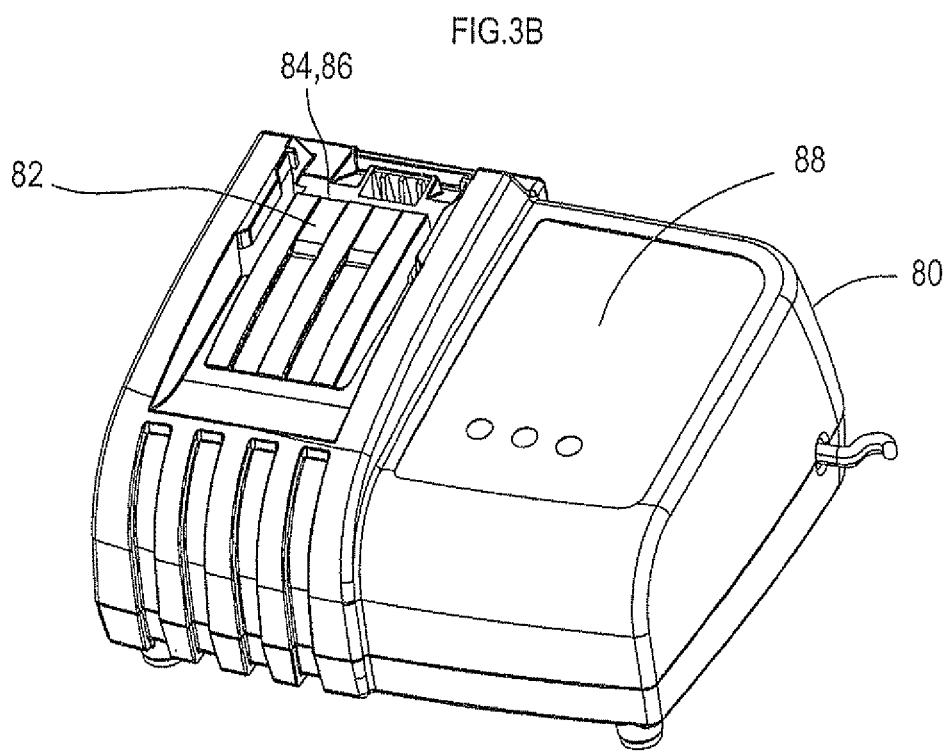
FIG. 3B is a perspective view showing an appearance of a battery charger.

Specifically, as shown in FIG. 3A, a connector portion 42 for connection to the battery pack attachment portion 24 of the main body 10 or a battery charger 80 shown in FIG. 3B is formed in an upper region of the battery pack 40. The connector portion 42 includes a power supply terminal portion 44 and a connection terminal portion 46 for connection to a battery and a control circuit inside the battery pack 40.

Figure 4:
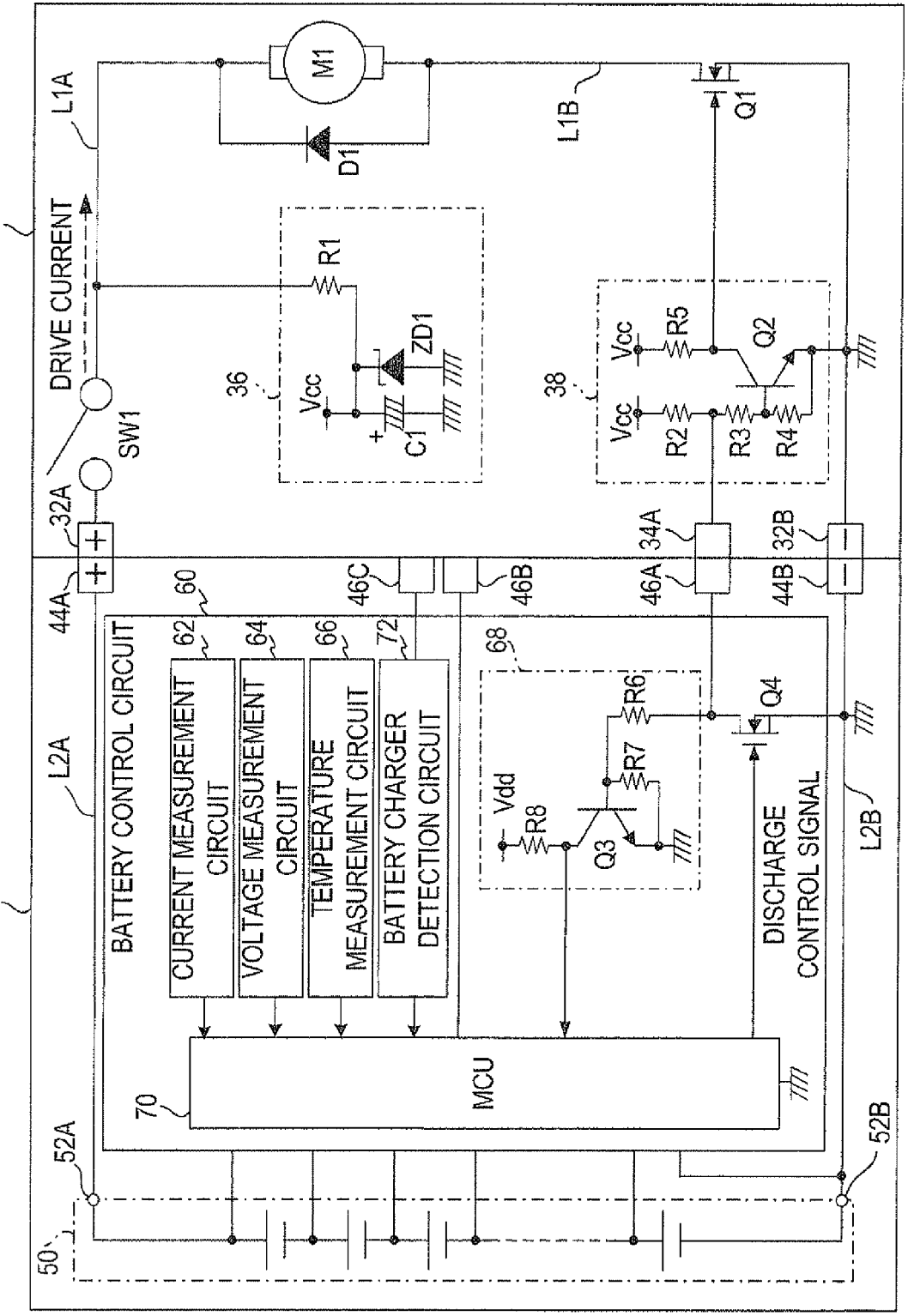
FIG. 4 is a circuit diagram showing an electronic circuit provided in the electric power tool main body and the battery pack of the embodiment.

When attached to the battery pack attachment portion 24 of the main body 10 through the connector portion 42, the battery pack 40 is electrically connected to internal circuits of the main body 10 through the power supply terminal portion 44 and the connection terminal portion 46, to thereby become capable of supplying DC power to the main body 10 (see FIG. 4).

As shown in FIG. 3B, formed on an upper region of the battery charger 80 are a battery pack attachment portion 82 and an indicator portion 88. The indicator portion 88 includes a plurality of indicator lamps for indicating that a charging operation to the battery pack 40 is being performed.

The battery pack attachment portion 82 of the battery charger 80 is configured such that the battery pack 40 can be attached by mating an end portion of the connector portion 42 of the battery pack 40 with the battery pack attachment portion 82, with the connector portion 42 facing downward, and then sliding the battery pack 40 in an attachment direction.

Provided on the battery pack attachment portion 82 are a power supply terminal portion 84 and a connection terminal portion 86, which are respectively to be electrically connected to the power supply terminal portion 44 and the connection terminal portion 46 of the battery pack 40 when the battery pack 40 is attached to the battery charger 80. When each of these terminal portions is connected to its counterpart, charge from the battery charger 80 to the battery pack 40 becomes possible (see FIG. 5).

The battery pack attachment portion 24 of the main body 10 is configured to be capable of mating with the connector portion 42 of the battery pack 40 as well as with the battery charger 80.

(Circuit Configuration of the Electric Power Tool Main Body 10)

FIG. 4 is a circuit diagram showing a circuit formed of the battery pack 40 and the main body 10 when the battery pack 40 is attached to the main body 10. This circuit is for controlling the drive motor M1.

As shown in FIG. 4, the main body 10 includes a positive terminal 32A, a negative terminal 32B, and a signal terminal 34A. The positive terminal 32A and the negative terminal 32B are terminals for connection of the main body 10 to the power supply terminal portion 44 of the battery pack 40. The signal terminal 34A is terminals for connection of the main body 10 to the connection terminal portion 46.

The positive terminal 32A is connected to one end of the drive motor M1 through a main switch SW1 and a positive power supply line L1A. The negative terminal 32B is connected to the other end of the drive motor M1, through a transistor Q1 for controlling current-supply to the drive motor M1 and a negative power supply line L1B.

In the present embodiment, the drive motor M1 is constituted as a brushed DC motor. This drive motor M1 is energized and driven when the transistor Q1 is turned on by an input signal from the battery pack 40 while the main switch SW1 is in an ON state.

A diode (a so-called flywheel diode) D1 is connected to the drive motor M1. The diode D1 is configured to return a high voltage, which is generated in the negative power supply line L1B when the transistor Q1 is turned off, to the positive power supply line L1A. Here, an N-channel MOSFET is used as the transistor Q1.

The main switch SW1 is switchable between ON and OFF states in conjunction with the above-described trigger switch 22. Specifically, the main switch SW1 is turned on when the trigger switch 22 is depressed, while the main switch SW1 is turned off when the trigger switch 22 is released.

The main body 10 also includes a control power circuit 36 which generates a power supply voltage for driving the internal circuit, and an input/output circuit 38 which inputs/outputs signals from/to the battery pack 40.

The control power circuit 36 includes a Zener diode ZD1 and a capacitor C1. A cathode of the Zener diode ZD1 is connected to the positive power supply line L1A through a resistor R1. An anode of the Zener diode ZD1 is earthed to a ground of the main body 10.

The capacitor C1 is constituted by an electrolytic capacitor. A positive side of the capacitor C1 is connected to the positive power supply line L1A through the resistor R1, together with the cathode of the Zener diode ZD1. A negative side of the capacitor C1 is earthed to the ground of the main body 10.

The negative terminal 32B is connected to the ground of the main body 10. When the battery pack 40 is attached to the main body 10, the ground of the main body 10 is connected to a negative power supply line L2B of the battery pack 40 (thus to a negative terminal 52B of a battery 50) through the negative terminal 32B.

Also, when the main switch SW1 is in an ON state, the positive power supply line L1A is connected to a positive power supply line L2A of the battery pack 40 (thus to a positive terminal 52A of the battery 50) through the positive terminal 32A.

When the main switch SW1 is in an ON state, a battery voltage (for example, DC 36 V) is applied to the anode of the Zener diode ZD1 from the positive power supply line L1A through the resistor R1, and the battery voltage is lowered to a predetermined constant voltage (for example, DC 5 V) by the Zener diode ZD1.

Then, the capacitor C1 is charged with the lowered DC voltage. A voltage between both terminals of the capacitor C1 is supplied to various internal circuits of the main body 10 as a power supply voltage Vcc to activate the internal circuits.

The input/output circuit 38 includes a transistor Q2 and resistors R2, R3, R4, and R5.

The transistor Q2 is constituted by an NPN bipolar transistor. A base of the transistor Q2 is connected to the signal terminal 34A through the resistor R3 while being earthed to the ground through the resistor R4.

The power supply voltage Vcc is applied to the signal terminal 34A through the resistor R2. The power supply voltage Vcc is also applied to a collector of the transistor Q2 through the resister R5. The collector of the transistor Q2 is also connected to a gate of the transistor Q1. An emitter of the transistor Q2 is earthed to the ground.

Resistance values of the resistors R2, R3, and R4 are set such that, when the power supply voltage Vcc has reached a predetermined voltage after the main switch SW1 is turned on, the transistor Q2 is turned on, to thereby make an electric potential of the signal terminal 34A become high level in a vicinity of the power supply voltage Vcc.

When the transistor Q2 is in an ON state, the gate of the transistor Q1 is earthed to the ground through the transistor Q2. Thereby, the transistor Q1 is brought into an OFF state and a current path to the drive motor M1 is interrupted.

When the signal terminal 34A is earthed to the ground through an internal circuit (a transistor Q4, which will be explained later) of the battery pack 40, the transistor Q2 is brought into an OFF state. In this state where the transistor Q2 is in the OFF state, the power supply voltage Vcc is applied to the gate of the transistor Q1 through the resistor R5, and thereby, the transistor Q1 is brought into an ON state; consequently, the current path to the drive motor M1 is formed.

In the present embodiment, the collector of the transistor Q2 is directly connected to the gate of the transistor Q1.

However, the collector of the transistor Q2 may be connected to the gate of the transistor Q1 through a drive circuit for switching the transistor Q1.

(Circuit Configuration of the Battery Pack 40)

The battery pack 40 includes a positive terminal 44A and a negative terminal 44B provided in the power supply terminal portion 44, three signal terminals 46A, 46B, and 46C provided in the connection terminal portion 46, the battery 50, and a battery control circuit 60.

The positive terminal 52A of the battery 50 is connected to the positive terminal 44A through the positive power supply line L2A. The negative terminal 52B of the battery 50 is connected to the negative terminal 44B through the negative power supply line L2B.

When the battery pack 40 is attached to the main body 10, the positive terminal 44A is connected to the positive terminal 32A of the main body 10, the negative terminal 44B is connected to the negative terminal 32B of the main body 10, and the signal terminal 46A is connected to the signal terminal 34A of the main body 10.

The signal terminals 46B and 46C are terminals for connection to the connection terminal portion 86 of the battery charger 80 when the battery pack 40 is attached to the battery charger 80. Each of the signal terminals 46B and 46C is in an open state when the battery pack 40 is attached to the main body 10.

The battery 50 is constituted by a plurality of (for example, ten) battery cells connected in series between the positive terminal 52A and the negative terminal 52B. The battery 50 generates a drive voltage (for example, DC 36 V) for driving the drive motor M1.

Each of the battery cells is constituted, for example, by a lithium-ion rechargeable battery that generates DC 3.6 V on a standalone basis. Therefore, the battery 50 can achieve high output power. For example, a discharge current which the battery 50 can output is 10 A or more.

The battery control circuit 60 includes a current measurement circuit 62, a voltage measurement circuit 64, a temperature measurement circuit 66, a switch operation detection circuit 68, a battery charger detection circuit 72, a main control unit (Main Control Unit: MCU) 70, and the transistor Q4.

The current measurement circuit 62 detects a current flowing through the positive power supply line L2A or the negative power supply line L2B, and outputs to the MCU 70 a current detection signal having a voltage value corresponding to the detected current.

The voltage measurement circuit 64 measures voltages of the respective battery cells constituting the battery 50 in sequence, and outputs to the MCU 70 voltage detection signals having voltage values corresponding to the measured voltages.

The temperature measurement circuit 66, which includes a thermistor disposed around the battery 50, measures a battery temperature through the thermistor, and outputs to the MCU 70 a temperature detection signal having a voltage value corresponding to the measured temperature.

The switch operation detection circuit 68 detects that the trigger switch 22 of the main body 10 is operated. The switch operation detection circuit 68 includes a transistor Q3, and resistors R6, R7, and R8.

The transistor Q3 is constituted by an NPN bipolar transistor. A base of the transistor Q3 is connected to the signal terminal 46A through the resistor R6 while being earthed to a ground of the battery pack 40 through the resistor R7. Also, an emitter of the transistor Q3 is earthed to the ground.

The ground of the battery pack 40 is connected to the negative power supply line L2B. Accordingly, when the battery pack 40 is attached to the main body 10, the ground of the battery pack 40 and the ground of the main body 10 have a same electric potential, and each of these grounds has a same electrical potential as a negative electrode of the battery 50.

A collector of the transistor Q3 is connected to the MCU 70 and also connected, through the resistor R8, to an output path of a power supply voltage Vdd (for example, DC 5 V) from a control power circuit (not shown) provided in the battery pack 40.

The control power circuit receives power supply from the battery 50, generates a given power supply voltage Vdd, and performs power supply to various electronic circuits in the battery pack 40. The control power circuit is constituted by, for example, a switching power circuit or the like.

The transistor Q4 is constituted by an N-channel MOSFET. A drain of the transistor Q4 is connected to the signal terminal 46A, to which the base of the transistor Q3 is connected through the resistor R6. Furthermore, a source of the transistor Q4 is earthed to the ground, and a gate of the transistor Q4 is connected to the MCU 70.

Therefore, the transistor Q4 is turned on/off by an output signal (a discharge control signal, which will be explained later) from the MCU 70. When the transistor Q4 is in an OFF state, the signal terminal 46A is in an open state.

Consequently, when the battery pack 40 is attached to the main body 10 and the trigger switch 22 is operated (the main switch SW1: ON), if the transistor Q4 is in an OFF state, a high level signal corresponding to the power supply voltage Vcc in the battery pack 40 is inputted from the signal terminal 34A of the main body 10 to the signal terminal 46A of the battery pack 40. In this case, the transistor Q3 in the switch operation detection circuit 68 is brought into an ON state, and an input signal from the switch operation detection circuit 68 to the MCU 70 becomes low level.

Even when the battery pack 40 is attached to the main body 10, if the trigger switch 22 is not operated (the main switch SW1: OFF), the signal terminal 34A of the main body 10 is low level (a ground potential); then, the transistor Q3 in the switch operation detection circuit 68 is brought into an OFF state, and the input signal from the switch operation detection circuit 68 to the MCU 70 becomes high level.

The battery charger detection circuit 72 is configured in a same manner as the switch operation detection circuit 68. Specifically, when the battery pack 40 is attached to the battery charger 80 and a high level signal (of, for example, DC 5 V) is inputted from the battery charger 80 to the signal terminal 46C, the battery charger detection circuit 72 inputs a detection signal indicating the high level signal input to the MCU 70.

Specifically, when the signal terminal 46C is in an open state, the battery charger detection circuit 72 inputs a high level signal corresponding to the power supply voltage Vdd to the MCU 70 through a pull-up resistor. When the high level signal is inputted from the battery charger 80 to the signal terminal 46C, a transistor connected to a signal path to the MCU 70 is brought into the ON state, and the signal path is earthed to the ground to make an output to the MCU 70 low level.

Accordingly, the MCU 70 can detect that the trigger switch 22 has been operated in the main body 10, to which the battery pack 40 is attached, based on the input signal from the switch operation detection circuit 68. Also, the MCU 70 can detect that the battery pack 40 has been attached to the battery charger 80 based on the input signal from the battery charger detection circuit 72.

The MCU 70 is constituted by a known microcomputer including a CPU, a ROM, a RAM, a rewritable nonvolatile memory, an input/output (I/O) port, an A/D converter, etc., and operates in accordance with various programs stored in the ROM. The operation of the MCU 70 will be described later.

(Circuit Configuration of the Battery Charger 80)

Figure 5:
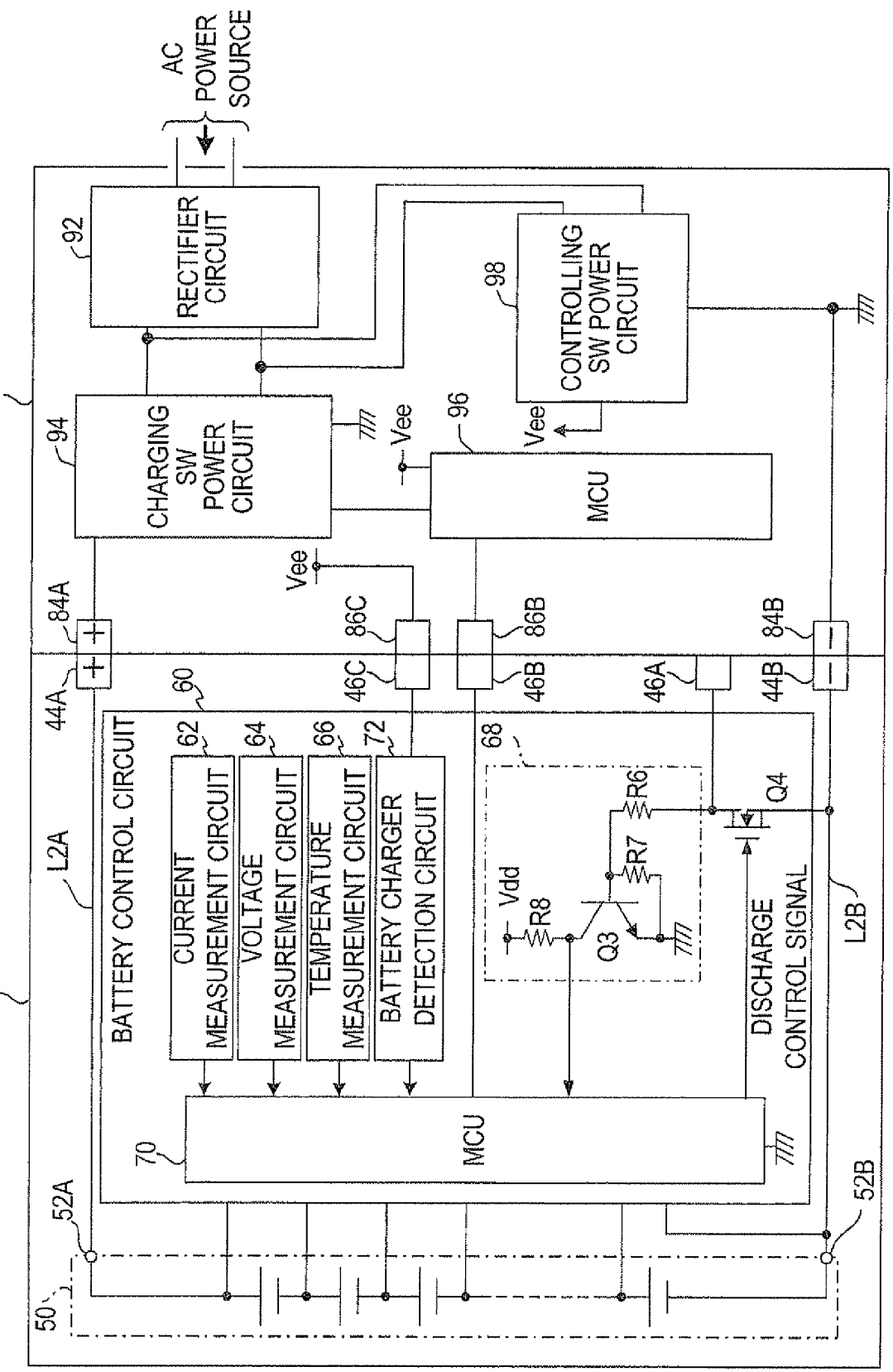
FIG. 5 is a circuit diagram showing an electronic circuit provided in the battery pack and the battery charger of the embodiment.

FIG. 5 is a circuit diagram showing a circuit formed of the battery pack 40 and the battery charger 80 when the battery pack 40 is attached to the battery charger 80. This circuit is a circuit for charging the battery.

As shown in FIG. 5, the battery charger 80 includes a positive terminal 84A and a negative terminal 84B, as the power supply terminal portion 84. The positive terminal 84A and the negative terminal 84B are terminals for connecting the battery charger 80 to the positive terminal 44A and the negative terminal 44B of the battery pack 40. Also, the battery charger 80 includes signal terminals 86B and 86C, as the connection terminal portion 86. The signal terminals 86B and 86C are terminals for connecting the battery charger 80 to, respectively, the signal terminals 46B and 46C of the battery pack 40.

The battery charger 80 includes a rectifier circuit 92, a charging switching power circuit 94, a main control unit (MCU) 96, and a controlling switching power circuit 98.

The rectifier circuit 92 rectifies AC voltage supplied from an AC power source such as a commercial power source. A rectified output from the rectifier circuit 92 is outputted to the charging switching power circuit 94 and the controlling switching power circuit 98.

The charging switching power circuit 94 is a switching circuit that performs charging to the battery 50 based on the output from the rectifier circuit 92; the charging switching power circuit 94 is drive-controlled by the MCU 96.

The MCU 96 is constituted by a microcomputer, in the same manner as in the MCU 70 in the battery pack 40. The MCU 96 acquires a battery state from the MCU 70 in the battery control circuit 60 through the signal terminals 46B and 86B and controls patterns of charging to the battery 50 (charge current, charge voltage, and the like) by drive-controlling the charging switching power circuit 94.

The controlling switching power circuit 98 generates a power supply voltage Vee (for example, DC 5 V) for operating an internal circuit of the MCU 96 and the like.

A ground of the battery charger 80 is connected to the negative terminal 52B of the battery 50, through the negative terminal 84B and the negative terminal 44B of the battery pack 40. A charge voltage generated in the charging switching power circuit 94 is applied to the positive terminal 52A of the battery 50, through the positive terminal 84A and the positive terminal 44A of the battery pack 40.

To the signal terminal 86C of the battery charger 80, the power supply voltage Vee generated in the controlling switching power circuit 98 is applied.

Accordingly, when the battery pack 40 is attached to the battery charger 80 and the power supply voltage Vee is generated in the controlling switching power circuit 98, a high level signal corresponding the power supply voltage Vee is inputted to the battery charger detection circuit 72 through the signal terminals 86C and 46C, in the battery pack 40. Then, a signal level of a detection signal inputted from the battery charger detection circuit 72 to the MCU 70 changes from high level to low level.

The battery charger 80 includes the indicator portion 88. The indicator portion 88 is provided with a plurality of indicator lamps. The indicator lamps of the indicator portion 88 are lit by the MCU 96 in accordance with a state of charging the battery 50.

(Operation of the MCU 70 in the Battery Pack 40)

Next, an explanation will be given about an operation of the MCU 70 in the battery pack 40.

The MCU 70 generally operates in a sleep mode (in other words, in a low power consumption mode), in which a detection signal from the switch operation detection circuit 68 or the battery charger detection circuit 72 is monitored as to whether the detection signal becomes low level from high level. When the detection signal from the switch operation detection circuit 68 or the battery charger detection circuit 72 has become low level from high level, the MCU 70 is activated and shifts to a normal mode in which the battery 50 is protected.

When the MCU 70 is in the sleep mode, the discharge control signal outputted from the MCU 70 to the gate of the transistor Q4 is low level, and the transistor Q4 is kept in an OFF state.

When the MCU 70 is activated by the detection signal (low level) from the switch operation detection circuit 68, the MCU 70 makes the discharge control signal high level to turn on the transistor Q4, and allows discharge from the battery 50 to the drive motor M1.

In short, when the transistor Q4 is brought into an ON state, the transistor Q2 in the input/output circuit 38 in the main body 10 is brought into an OFF state and the transistor Q1 provided on the current path to the drive motor M1 is brought into an ON state; therefore, a current flows through the drive motor M1 to rotate the drive motor M1.

When the MCU 70 makes the discharge control signal high level as such and allows the discharge from the battery 50 to the drive motor M1 (i.e., during the discharge from the battery 50), the MCU 70 executes a discharge control process that protects the battery 50 from overdischarge and the like.

In the discharge control process, a discharge current limitation processing, an overdischarge limitation processing, and a battery temperature limitation processing are performed. Specifically, processings, which limit the discharge from the battery 50 to the drive motor M1 based on detection results by the current measurement circuit 62, the voltage measurement circuit 64, and the temperature measurement circuit 66, are executed.

In the discharge current limitation processing, when the discharge current detected in the current measurement circuit 62 during the discharge has exceeded a preset threshold value, it is determined that overcurrent is flowing; then, the discharge control signal is made low level, thereby suspending the discharge from the battery 50 to the drive motor M1.

In the overdischarge limitation processing, when the battery voltage detected in the voltage measurement circuit 64 during the discharge has been lowered below a preset threshold value, it is determined that the battery 50 is in an overdischarge state; then, the discharge control signal is made low level, thereby suspending the discharge from the battery 50 to the drive motor M1.

In the battery temperature limitation processing, when the battery temperature detected in the temperature measurement circuit 66 during the discharge has exceeded a preset threshold value, it is determined that the battery 50 is in an overheat state; then, the discharge control signal is made low level, thereby suspending the discharge from the battery 50 to the drive motor M1.

When the discharge control signal is made low level and the discharge from the battery 50 to the drive motor M1 is suspended in any of the above-described limitation processings, a user detects an abnormality and releases the trigger switch 22. Consequently, the main switch SW1 is brought into an OFF state, and in the main body 10 the power supply voltage Vcc outputted from the control power circuit 36 is lowered, to thereby make an input signal from the signal terminal 34A to the signal terminal 46A low level.

Accordingly, when the MCU 70 has suspended the discharge from the battery 50 to the drive motor M1 by the above-described limitation processings, the MCU 70 recognizes that the main switch SW1 has been turned off by determining whether or not the detection signal from the switch operation detection circuit 68 has become high level.

After recognizing that the main switch SW1 has been turned off, the MCU 70 waits for the main switch SW1 to be turned on until a predetermined time period elapses. When the main switch SW1 is turned on before the predetermined time period elapses, the MCU 70 makes the discharge control signal high level again, and allows the discharge (in other words, drive of the drive motor M1). If the main switch SW1 is not turned on before the predetermined time period elapses, the MCU 70 shifts to a sleep mode.

Since the MCU 70 continues to output the discharge control signal (high level) unless an abnormality such as overcurrent is detected in the above-described limitation processings, the MCU 70 cannot detect an OFF state of the main switch SW1 (in other words, a suspension of operation of the trigger switch 22) through the switch operation detection circuit 68.

Accordingly, the MCU 70 measures a suspension period of current-carrying to the drive motor M1 based on the detection signal from the current measurement circuit 62 and the like while the MCU 70 is outputting the discharge control signal (high level) after shifting from a sleep mode to a normal mode, and then, shifts to a sleep mode when the suspension period of current-carrying has reached a predetermined time period.

When the MCU 70 detects, in the above-described discharge control process, that overdischarge of the battery 50 exists and suspends the discharge, the MCU 70 stores a record of the overdischarge in a non-volatile memory.

Meanwhile, when the MCU 70 is activated by the detection signal (low level) from the battery charger detection circuit 72, the MCU 70 outputs various information indicating a status (battery voltage, battery capacity, ant the like) of the battery 50 to the MCU 96 of the battery charger 80 through the signal terminals 46B and 86B. Thereafter, when charge from the battery charger 80 to the battery 50 is started, the MCU 70 executes a charge control process for battery protection.

The charge control process includes: a step of determining whether or not an abnormality such as overcharge to the battery 50 and/or overheat of the battery 50 has occurred based on a detection result by each of the above-described measurement circuits 62, 64 and 66; and, if an abnormality is determined to exist, a step of transmitting a command signal to suspend charging or to reduce charge current, to the battery charger 80 through the signal terminals 46B and 86B.

When the MCU 70 detects overcharge of the battery 50 and suspends charging in the charge control process, the MCU 70 stores a record of the overcharge in the non-volatile memory.

The charge control process is continued until the detection signal from the battery charger detection circuit 72 becomes high level (in other words, until the power supply voltage Vee ceases to be inputted from the battery charger 80). When the detection signal becomes high level, the MCU 70 determines that the battery pack 40 has been detached from the battery charger 80, and shifts to a sleep mode.

As described above, the MCU 70 in the battery pack 40 determines whether or not the battery temperature detected by the temperature measurement circuit 66 during the discharge from the battery 50 to the drive motor M1 exceeds a threshold value. When the battery temperature has exceeded the threshold value, the MCU 70 suspends the discharge. Moreover, the MCU 70 transmits the battery temperature detected with the temperature measurement circuit 66 during the charge from the battery charger 80 to the battery 50, to the MCU 96 of the battery charger 80, thereby inhibiting the battery temperature from exceeding the threshold value during the charge.

However, the battery temperature detected by the temperature measurement circuit 66 is a temperature detected by the thermistor disposed around the battery 50, and not an internal temperature of the battery 50. For this reason, when the internal temperature of the battery 50 changes (increases) during the discharge or the charge of the battery 50, a temperature difference occurs between the battery temperature detected by the temperature measurement circuit 66 and the internal temperature of the battery 50. Consequently, the battery 50 may not be properly protected.

Figure 6:
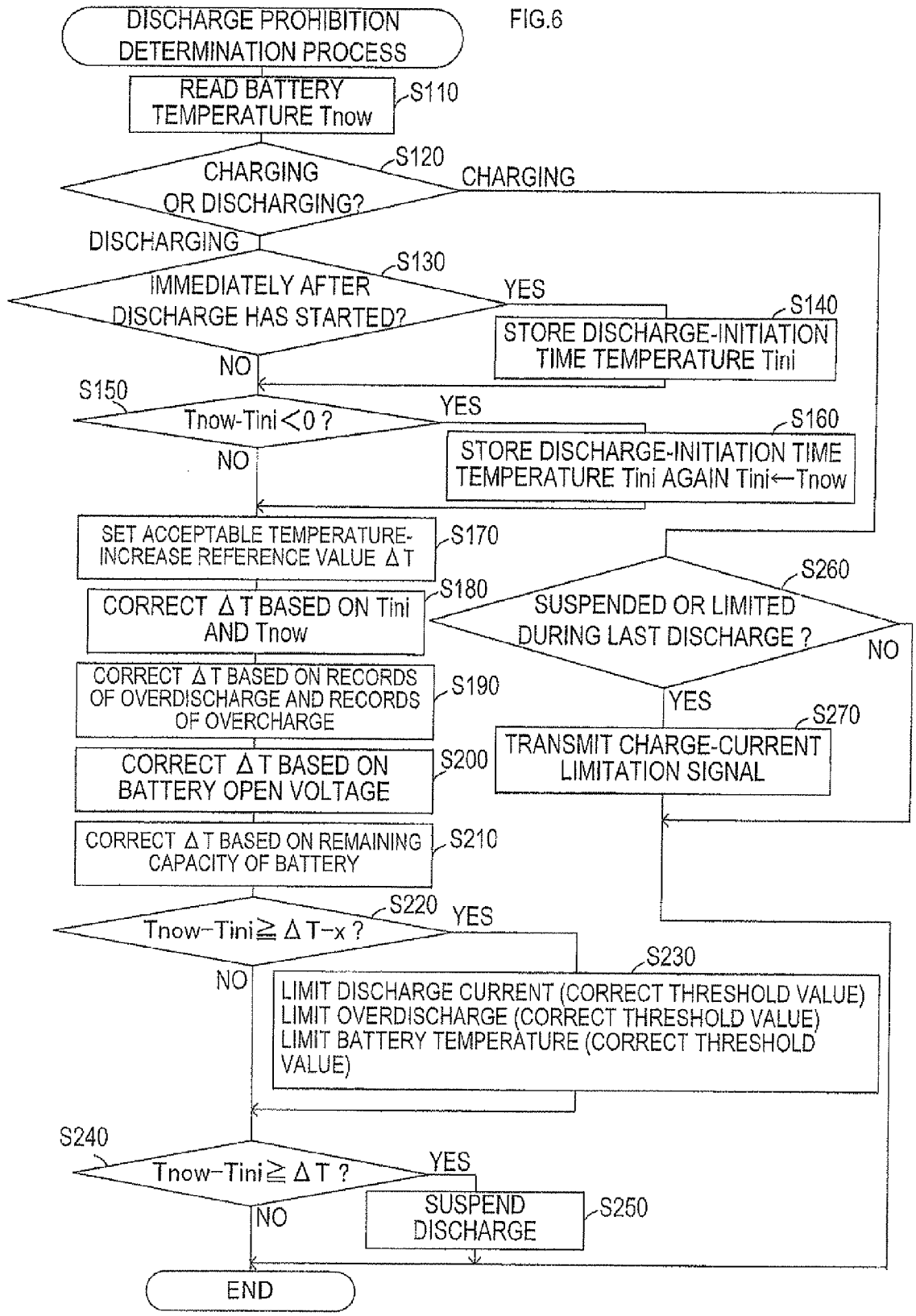
FIG. 6 is a flowchart showing a discharge prohibition determination process executed by an MCU in the battery pack.

Thus, in the present embodiment, when the MCU 70 is in a normal mode, not only the above-explained control process, but also a discharge prohibition determination process shown in FIG. 6 is executed.

Hereinafter, the discharge prohibition determination process will be explained.

(Discharge Prohibition Determination Process)

The discharge prohibition determination process is repeatedly executed by the MCU 70 with a constant period (for example, per 0.5 seconds). When the discharge prohibition determination process is started, a read processing is firstly executed in S110 (S represents a "step"). The read processing reads a current battery temperature (specifically, a surface temperature of the battery 50) Tnow from the temperature measurement circuit 66.

The read processing includes, not only a step of reading the battery temperature Tnow from the temperature measurement circuit 66, but also a step of averaging the battery temperatures Tnow which have been read a plurality of times (in other words, during a given time period), or a step of removing an error component (in other words, an unnecessary noise component) of a detected temperature obtained from the temperature measurement circuit 66, by performing moving-averaging the battery temperatures Tnow which have been read a plurality of times.

Next, in S120, it is determined whether discharge from the battery 50 is being performed or charge to the battery 50 is being performed at this point in time. If discharge from the battery 50 is being performed at this point in time, it is determined in subsequent S130 whether or not, at this point in time, it is immediately after the discharge has just started. If it is immediately after the discharge has just started, the process proceeds to S140 to store the current battery temperature Tnow obtained by the read processing in S110, as a discharge-initiation time temperature Tini in a memory (RAM, etc.).

If the discharge-initiation time temperature Tini is stored in the memory in S140, or if it is determined in S130 that it is not immediately after the discharge has just started at this point in time, the process proceeds to S150. In S150, a difference between the current battery temperature Tnow obtained in S110 and the discharge-initiation time temperature Tini stored in the memory in S140 is calculated, i.e., a temperature increase amount (=Tnow−Tini) of the battery 50 is calculated, to determine whether or not the temperature increase amount "Tnow−Tini" is a negative value.

If it is determined in S150 that "Tnow−Tini", which is an estimated value of an internal temperature of the battery 50, is a negative value, the process proceeds to S160. In S160, since the current battery temperature Tnow obtained in S110 is below the discharge-initiation time temperature Tini, the current battery temperature Tnow is renewed to be the discharge-initiation time temperature Tini in the memory. Then, the process proceeds to S170.

On the other hand, if it is determined in S150 that "Tnow−Tini", which is the temperature increase amount of the battery 50, is not a negative value, the process simply proceeds to S170.

When the MCU 70 is activated and remains in a normal mode which is before the MCU 70 shifts to a sleep mode, the discharge from the battery 50 is not performed continuously, but performed intermittently in accordance with an operation/suspension of the trigger switch 22. Therefore, there may be a case where the battery temperature Tnow becomes lower than the discharge-initiation time temperature Tini due to temporary suspensions of the discharge. For this reason, the discharge-initiation time temperature Tini is to be renewed by the processings of S150 and S160.

Next, in S170, an acceptable temperature-increase reference value ΔT, which has been stored beforehand in a memory (ROM, etc.), is read out from the memory to be set as a threshold value for determining whether to suspend the discharge.

That is to say, since the temperature increase amount "Tnow−Tini" is proportional to an amount of change in the internal temperature of the battery 50, the temperature increase amount "Tnow−Tini" is used as the estimated value representing the internal temperature of the battery 50, in the present embodiment. Specifically, based on the temperature increase amount "Tnow−Tini" as the estimated value, a temperature increase (i.e., overheat) inside of the battery 50 is determined.

Therefore, in S170, the acceptable temperature-increase reference value ΔT is set as a set temperature for the aforementioned determination of overheat. Then, in the subsequent processings, it is determined whether to suspend the discharge based on the acceptable temperature-increase reference value ΔT.

If the acceptable temperature-increase reference value ΔT is set in S170, the process proceeds to S180. In S180, minus-correction of the acceptable temperature-increase reference value ΔT is performed based on the discharge-initiation time temperature Tini and the battery temperature Tnow, such that as each of the temperatures Tini and Tnow is higher, the acceptable temperature-increase reference value ΔT becomes lower.

Figure 7:
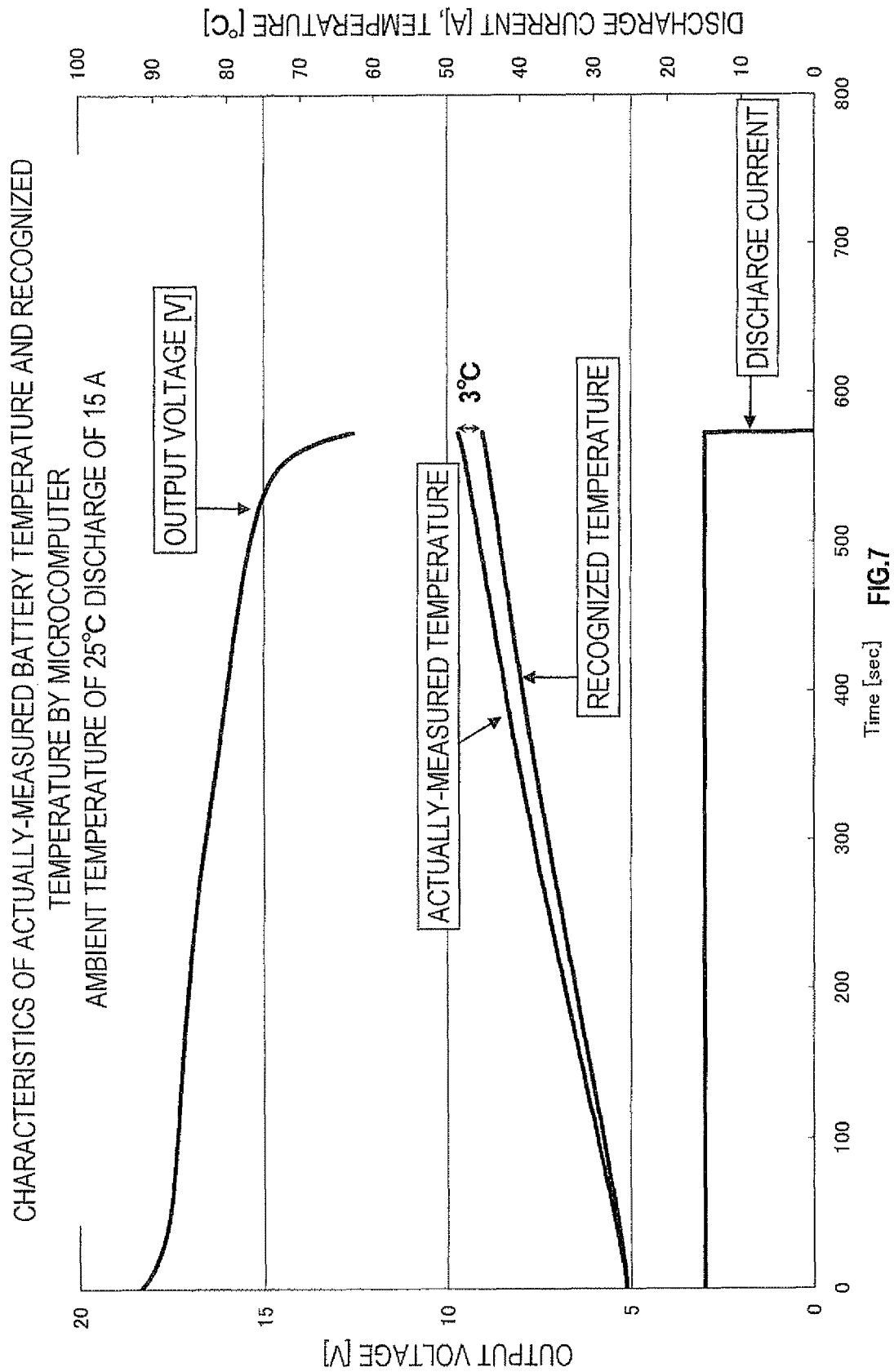
FIG. 7 is an explanatory diagram showing a relationship between an actually-measured temperature of a battery surface measured during discharge of the battery, and a recognized temperature by a microcomputer.

A reason why the acceptable temperature-increase reference value ΔT is corrected in the above-described manner is obvious from measurement results shown in FIGS. 7 and 8. Specifically, as the discharge-initiation time temperature Tini or the battery temperature Tnow is higher, a difference between a sensor temperature (recognized temperature) obtained by the temperature measurement circuit 66 and an actually-measured temperature (and therefore, the internal temperature)(in other words, the temperature increase amount "Tnow−Tini") becomes smaller; in this case, if the acceptable temperature-increase reference value ΔT is a constant value, it is difficult to determine whether or not overheat exists inside the battery 50.

Next, in S190, records of overdischarge and records of overcharge are read out from a non-volatile memory; then, minus-correction of the acceptable temperature-increase reference value ΔT is performed such that as the number of records of each of overdischarge and overcharge is larger, the acceptable temperature-increase reference value ΔT becomes lower.

In subsequent S200, an open voltage (latest value) of the battery 50, which has been measured and stored in the non-volatile memory, is read out, and then, minus-correction of the acceptable temperature-increase reference value ΔT is performed such that the lower the open voltage is, the lower the acceptable temperature-increase reference value ΔT becomes.

In further subsequent S210, a remaining capacity (latest value) of the battery 50, which has been measured and stored in the non-volatile memory, is read out, and then, minus-correction of the acceptable temperature-increase reference value ΔT is performed such that the lower the remaining capacity is, the lower the acceptable temperature-increase reference value ΔT becomes.

That is to say, in S190 to S210, when the number of records of overdischarge and overcharge is larger, when the open voltage is low, or when the remaining capacity is low, the inside of the battery 50 is easily overheated; therefore, in order to facilitate determination of whether or not the inside of the battery 50 is overheated from the temperature increase amount "Tnow−Tini", minus-correction of the acceptable temperature-increase reference value ΔT is performed.

Moreover, when the open voltage is low (when the remaining capacity is low), the difference between the actually-measured temperature and the recognized temperature becomes smaller due to a short discharge period. Therefore, minus-correction of the acceptable temperature-increase reference value ΔT is performed.

Here, in performing the minus-correction of the acceptable temperature-increase reference value ΔT in S180 to S210, the minus-correction may be performed in the following manner: whether each of the aforementioned parameters is higher or lower than a preset threshold value is determined, thereby determining whether or not the minus-correction is necessary; then, minus-correction of the acceptable temperature-increase reference value ΔT may be performed by a set value. In this case, the minus-correction of the acceptable temperature-increase reference value ΔT may be performed by calculating a correction amount based on a value of each of the aforementioned parameters.

When a series of correction processings in the aforementioned S180 to S210 are executed, the process proceeds to S220. In S220, the temperature increase amount "Tnow−Tini" is calculated, and it is determined whether or not a value of the temperature increase amount "Tnow−Tini" is equal to or greater than a determination value "ΔT−x" obtained by deducting a predetermined value x from the acceptable temperature-increase reference value ΔT.

If the temperature increase amount "Tnow−Tini" is equal to or greater than the determination value "ΔT−x", the process proceeds to S230. In S230, the respective threshold values used to determine whether to suspend the discharge in the above-described discharge current limitation processing, the overdischarge limitation processing, and the battery temperature limitation processing are corrected.

Specifically, the threshold value to be used in the discharge current limitation processing for determination of overcurrent is lowered, the threshold value to be used in the overdischarge limitation processing for determination of overdischarge is increased, and the threshold value to be used in the battery temperature limitation processing for determination of overheat is lowered. These operations allow an easy execution of suspension of the discharge by each of the limitation processings.

Here, in S230, a correction value, by which each of the aforementioned threshold values are corrected, may be a constant value. Alternatively, the correction value may be set such that, depending on a difference between the temperature increase amount "Tnow−Tini" and the determination value "ΔT−x", the larger the difference is, the larger the correction value becomes.

When the threshold value to be used in each of the above-described limitation processings is corrected in S230, or when it is determined in S220 that the temperature increase amount "Tnow−Tini" is less than the determination value "ΔT−x", the process proceeds to S240. In S240, it is determined whether or not the temperature increase amount "Tnow−Tini" is equal to or greater than the acceptable temperature-increase reference value ΔT.

If the temperature increase amount "Tnow−Tini" is equal to or greater than the acceptable temperature-increase reference value ΔT, it is determined that the internal temperature of the battery 50 has reached an acceptable upper-limit temperature, and then, the process proceeds to S250. In S250, a discharge control signal is changed from high level to low level, thereby suspending the discharge from the battery 50. Thereafter, the discharge prohibition determination process is terminated.

Meanwhile, if the temperature increase amount "Tnow−Tini" is less than the acceptable temperature-increase reference value ΔT, the discharge prohibition determination process is simply terminated.

On the other hand, when it is determined in S120 that charge to the battery 50 is being performed at this point in time, the process proceeds to S260. In S260, it is determined whether discharge control in normal times was limited in S230 since the temperature increase amount "Tnow−Tini" of the battery 50 has reached the determination value "ΔT−x" at a time of a previous discharge, or the discharge was suspended since the temperature increase amount "Tnow−Tini" of the battery has reached the acceptable temperature-increase reference value ΔT at a time of a previous discharge.

When the discharge control was limited at the time of the previous discharge, or when the discharge was suspended at the time of the previous discharge, it is determined that the internal temperature of the battery 50 can be easily increased; then, the process proceeds to S270. In S270, a charge-current limitation signal is transmitted to the MCU 96 of the battery charger 80, thereby lowering an upper limit of a charge current to the battery 50 than in normal times, and then, the discharge prohibition determination process is terminated.

Meanwhile, when it is determined in S260 that neither discharge suspension nor discharge control was limited at a time of the previous discharge, the discharge prohibition determination process is simply terminated.

Effects of the Embodiment

As explained above, in the present embodiment, the MCU 70 provided in the battery pack 40 executes the discharge prohibition determination process shown in FIG. 6. In the discharge prohibition determination process, during the discharge from the battery pack 40 to the drive motor M1, the temperature increase amount "Tnow−Tini" of the battery temperature (specifically, the surface temperature) measured by the temperature measurement circuit 66, which is an increase amount from when the discharge is started, is calculated as the estimated value indicating the internal temperature of the battery 50. When the temperature increase amount "Tnow−Tini" is equal to or greater than the acceptable temperature-increase reference value ΔT, it is determined that a temperature of the inside of the battery 50 has reached the acceptable upper-limit temperature, to thereby suspend the discharge (S240, S250).

For this reason, according to the present embodiment, even if the battery 50 cannot be protected only by the battery temperature limitation processing which is to be executed during the discharge since a difference between the battery temperature (surface temperature) measured by the temperature measurement circuit 66 and the internal temperature of the battery 50 becomes greater, it is possible to suppress deterioration of the battery 50 due to overheat by estimating the internal temperature of the battery 50.

Moreover, in the discharge prohibition determination process, when the temperature increase amount "Tnow−Tini" becomes equal to or greater than the determination value "ΔT−x" which is smaller than the acceptable temperature-increase reference value ΔT during the discharge of the battery 50, the respective threshold values, which are to be used to determine whether to suspend the discharge in the discharge current limitation processing, the overdischarge limitation processing, and the battery temperature limitation processing, are corrected to strictly limit the discharge by the respective limitation processings. (S220, S230).

Therefore, according to the present embodiment, it is also possible to suspend the discharge by each of the aforementioned limitation processings before the internal temperature of the battery 50 has reached the acceptable upper-limit temperature. Consequently, the present embodiment makes it possible to suppress deterioration due to overheat of the battery 50 in a more favorable manner.

Moreover, in the discharge prohibition determination process, based on the discharge-initiation time temperature Tini and the battery temperature Tnow, charge records and discharge records, and the open voltage and the remaining capacity of the battery 50, minus-correction of the acceptable temperature-increase reference value ΔT is performed such that the higher the surface temperature of the battery 50 is or the worse a condition of the battery 50 is, the smaller the acceptable temperature-increase reference value ΔT becomes (S180 to S210).

Thus, according to the present embodiment, it is possible to accurately determine that the internal temperature of the battery 50 has reached an acceptable upper-limit value (or, has become closer to the acceptable upper-limit value) by using the temperature increase amount "Tnow−Tini" and the acceptable temperature-increase reference value ΔT, thereby properly executing suspension of the discharge (or limitation of the discharge) from the battery 50.

Moreover, when the discharge is suspended (or the discharge is limited) in the discharge prohibition determination process during the discharge of the battery 50, the charge-current limitation signal is transmitted to the MCU of the battery charger 80 during a next charge to the battery 50, so as to further limit the upper limit of the charge current than in normal times. Therefore, according to the present embodiment, it is possible to suppress overheat of the inside of the battery 50 during the next charge to the battery 50.

From now on, explanations will be given with respect to corresponding relationships of terms. In the present embodiment, the temperature measurement circuit 66 provided in the battery pack 40 corresponds to an example of a detection device in an internal temperature estimation unit; the processings of S130 to S160 in the discharge prohibition determination process shown in FIG. 6 corresponds to an example of an initial-value setting device in the internal temperature estimation unit; and the processings of S220 and S240 correspond to an example of a temperature increase amount calculation device in the internal temperature estimation unit. These processings of S220 and S240 also correspond to an example of a determination device in an apparatus for electric power tool.

Moreover, the processings of S220 to S250 in the discharge prohibition determination process shown in FIG. 6 corresponds to an example of a protection device in the apparatus for electric power tool; the processing of S180 corresponds to an example of a first set-temperature correction device in the apparatus for electric power tool; and the processings of S190 to S210 correspond to an example of a second set-temperature correction device in the apparatus for electric power tool.

Modified Examples

Although one embodiment of the present invention has been described above, the present invention should not be limited to the above-described embodiment, but may be practiced in various forms within a scope not departing from the spirit of the present invention.

For example, it has been explained in the above-described embodiment that during the discharge of the battery 50, the temperature increase amount "Tnow−Tini" is calculated as the estimated value of the internal temperature of the battery 50, and then, when the calculated temperature increase amount "Tnow−Tini" has reached the determination value "ΔT−x" or the acceptable temperature-increase reference value ΔT, each of which is the set temperature for determination of overheat, the discharge is to be limited or suspended.

However, it may be configured such that, during the charging of the battery 50, the temperature increase amount "Tnow−Tini" is calculated as the estimated value of the internal temperature of the battery 50, and then, when the calculated temperature increase amount "Tnow−Tini" has reached the determination value "ΔT−x" or the acceptable temperature-increase reference value ΔT, each of which is the set-temperature for determination of overheat, the charge is to be limited or suspended.

Moreover, it has been described in the above-described embodiment that the discharge prohibition determination process shown in FIG. 6 is executed by the MCU 70 in the battery pack 40. However, the discharge prohibition determination process may be executed by an MCU for discharge control, which is provided in the main body 10.

Furthermore, in a case where, during the charge to the battery 50 as described above, the temperature increase amount "Tnow−Tini" is calculated and the charge to the battery 50 is limited or suspended based on results of the calculation (i.e., the estimated value of the internal temperature), a charge prohibition determination process therefor may be executed by the MCU 70 in the battery pack 40, or by the MCU 96 in the battery charger 80.

In the above-described embodiment, it has been explained that the acceptable temperature-increase reference value ΔT is corrected in S180 to S210. However, the processings in S180 to S210 are not necessarily executed. For example, any of the processings in S180 to S210 may be executed, e.g., the processing in S180 and the processing in S200 are executed.

Although in the above-described embodiment, explanations have been given with respect to the driver drill to which the present invention is applied, the present invention may be applied to an electric power tool which is not a driver drill.

Furthermore, although the brushed DC motor is employed as the drive motor M1 in the above-described embodiment, a brushless DC motor or an AC motor may be employed. However, if the brushless DC motor or the AC motor is employed as the drive motor M1, the main body 10 needs to be constituted accordingly.

Furthermore, although a bipolar transistor or a MOSFET is employed as a transistor in the above-described embodiment, other switching elements may be employed.

The invention claimed is:

1. An internal temperature estimation unit for battery for electric power tool, which is provided in an apparatus for electric power tool and is configured to read a detected temperature from a temperature detection device that is configured to detect a temperature of a cell of a battery that is a power source of an electric power tool so as to estimate an internal temperature of the battery based on the detected temperature, the unit comprising:
   an initial-value setting device which is configured to read, when a discharge from the battery is started, the detected temperature from the temperature detection device and to set the detected temperature as an initial value; and
   a temperature increase amount calculation device which is configured to read, during the discharge from the battery, the detected temperature from the temperature detection device and to calculate a temperature increase amount of the cell of the battery based on a latest value of the read detected temperature and the initial value set by the initial-value setting device, and
   wherein the internal temperature estimation unit is configured to output the temperature increase amount calculated by the temperature increase amount calculation device, as an estimated value representing the internal temperature of the battery.

2. The internal temperature estimation unit for battery for electric power tool according to claim 1,
   wherein, the temperature increase amount calculation device is configured to renew the initial value with the detected temperature read from the temperature detection device, when the detected temperature read from the temperature detection device is below the initial value set by the initial-value setting device.

3. An apparatus for electric power tool comprising:
   an internal temperature estimation unit for battery for electric power tool, which is provided in the apparatus for electric power tool and is configured to read a detected temperature from a temperature detection device that is configured to detect a temperature of a cell of a battery that is a power source of an electric power tool so as to estimate an internal temperature of the battery based on the detected temperature, the unit including:
      an initial-value setting device which is configured to read, when a discharge from the battery is started, the detected temperature from the temperature detection device and to set the detected temperature as an initial value; and
      a temperature increase amount calculation device which is configured to read, during the discharge from the battery, the detected temperature from the temperature detection device and to calculate a temperature increase amount of the cell of the battery based on a latest value of the read detected temperature and the initial value set by the initial-value setting device, and
      wherein the internal temperature estimation unit is configured to output the temperature increase amount calculated by the temperature increase amount calculation device, as an estimated value representing the internal temperature of the battery;
   a determination device that is configured to determine whether or not the estimated value obtained by the internal temperature estimation unit and representing the internal temperature of the battery exceeds a predetermined set temperature for overheat determination; and
   a protection device that is configured to protect the battery by suspending or limiting the discharge from the battery when the determination device determines that the estimated value of the internal temperature exceeds the set temperature.

4. The apparatus for electric power tool according to claim 3, further including a first set-temperature correction device that is configured to correct the set temperature for use in the overheat determination of the battery by the determination device, based on the detected temperature or the initial value of the detected temperature which is used to calculate the estimated value by the internal temperature estimation unit, such that the higher the detected temperature or the initial value is, the lower the set temperature becomes.

5. The apparatus for electric power tool according to claim 3, further including a second set-temperature correction device that is configured to correct the set temperature for use in the overheat determination of the battery by the determination device, based on at least one of charge and discharge records, an open voltage, and a remaining capacity of the battery.

6. The apparatus for electric power tool according to claim 3,
  wherein, the protection device is configured to limit a discharge current that flows from the battery in a next discharge, when the protection device suspends or limits the discharge from the battery during the discharge from the battery.

7. The apparatus for electric power tool according to claim 3, wherein the apparatus is a battery pack containing the battery therein, an electric power tool main body to which the battery pack is detachably attached, or a battery charger to which the battery pack is detachably attached.

* * * * *